(12) United States Patent
Yang et al.

(10) Patent No.: US 8,565,014 B2
(45) Date of Patent: Oct. 22, 2013

(54) SHARED BIT LINE SMT MRAM ARRAY WITH SHUNTING TRANSISTORS BETWEEN BIT LINES

(71) Applicants: MagIC Technologies, Inc., Milpitas, CA (US); International Business Machines Corporation, Yorktown Heights, NY (US)

(72) Inventors: Hsu-Kai Yang, Pleasanton, CA (US); Yutaka Nakamura, Kyoto (JP); John Debrosse, Colchester, VT (US)

(73) Assignees: MagIC Technologies, Inc., Milpitas, CA (US); International Business Machines Corporation, Yorktown Heghts, NY (US)

( * ) Notice: Subject to any disclaimer, the term of this patent is extended or adjusted under 35 U.S.C. 154(b) by 0 days.

(21) Appl. No.: 13/887,287

(22) Filed: May 4, 2013

(65) Prior Publication Data

US 2013/0250672 A1    Sep. 26, 2013

Related U.S. Application Data

(62) Division of application No. 12/803,523, filed on Jun. 29, 2010, now Pat. No. 8,437,181.

(51) Int. Cl.
*G11C 11/00* (2006.01)
(52) U.S. Cl.
USPC ............................ 365/158; 365/148; 365/171
(58) Field of Classification Search
USPC ......... 365/48, 55, 62, 66, 74, 78, 80–93, 100, 365/130, 131, 148, 158, 171–173, 225.5, 365/243.5
See application file for complete search history.

(56) References Cited

U.S. PATENT DOCUMENTS

| | | | |
|---|---|---|---|
| 6,055,178 A | 4/2000 | Naji | |
| 6,577,527 B2 | 6/2003 | Freitag et al. | |
| 7,376,006 B2 | 5/2008 | Bednorz et al. | |
| 7,813,159 B2 * | 10/2010 | Inaba | 365/148 |
| 2005/0078509 A1 * | 4/2005 | Parkin | 365/158 |
| 2006/0018057 A1 | 1/2006 | Huai | |
| 2006/0023490 A1 | 2/2006 | Boeve | |
| 2007/0279963 A1 * | 12/2007 | Tsuchida et al. | 365/148 |
| 2008/0043514 A1 | 2/2008 | Ueda | |
| 2008/0203503 A1 * | 8/2008 | Asao | 257/421 |

(Continued)

OTHER PUBLICATIONS

"A Novel Nonvolatile Memory with Spin Torque Transfer Magnetization Switching: Spin-RAM," by M. Hosomi et al., 2005 IEEE, International Electron Devices Meeting 2005, IEDM Technical Digest, Dec. 2005, pp. 459-462.

*Primary Examiner* — Harry W Byrne
(74) *Attorney, Agent, or Firm* — Saile Ackerman LLC; Stephen B. Ackerman; Billy Knowles (57) ABSTRACT

An array of rows and columns of SMT MRAM cells has each of the columns associated with one of its adjacent columns. Each of the SMT MRAM cells of the column is connected to a true data bit line and each of the SMT MRAM cells of the associated pair of columns is connected to a shared complement data bit line. A shunting switch device is connected between each of the true data bit lines and the shared complement data bit line for selectively connecting one of the true data bit lines to the shared complement data bit line to effectively reduce the resistance of the complement data bit line and to eliminate program disturb effects in adjacent non-selected columns of the SMT MRAM cells.

5 Claims, 7 Drawing Sheets

(56) References Cited

U.S. PATENT DOCUMENTS

| | | |
|---|---|---|
| 2009/0014703 A1 | 1/2009 | Inaba |
| 2010/0091557 A1 | 4/2010 | Hidaka |
| 2010/0177558 A1* | 7/2010 | Sakimura et al. ............. 365/158 |

* cited by examiner

SHARED BIT LINE SMT MRAM ARRAY WITH SHUNTING TRANSISTORS BETWEEN BIT LINES

The present disclosure is a divisional application that claims priority under 35 U.S.C. §120 from U.S. patent application Ser. No. 12/803,523, filing date Jun. 29, 2010, now U.S. Pat. No. 8,437,181, issued May 7, 2013, assigned to a common assignee and herein incorporated by reference in its entirety.

BACKGROUND

This disclosure relates generally to memory cells and array structures for memory cells. More particularly, this disclosure relates to magnetic random access memory (MRAM) cells and array structures for spin moment transfer (SMT) MRAM cells.

SUMMARY

The term spin moment transfer MRAM refers to a magnetic tunnel junction (MTJ) random access memory (RAM). In this context, the term "spin" refers to the angular momentum of electrons passing through an MTJ that will alter the magnetic moment of a free layer of an MTJ device. Electrons possess both electric charge and angular momentum (or spin). It is known in the art that a current of spin-polarized electrons can change the magnetic orientation of a free ferromagnetic layer of an MTJ via an exchange of spin angular momentum.

"A Novel Nonvolatile Memory with Spin-torque Transfer Magnetization Switching: Spin-Ram", Hosomi, et al., IEEE International Electron Devices Meeting, 2005. IEDM Technical Digest. December 2005, pp.: 459-462, provides a nonvolatile memory utilizing spin-torque transfer magnetization switching (STS), abbreviated Spin-RAM. The Spin-RAM is programmed by magnetization reversal through an interaction of a spin momentum-torque-transferred current and a magnetic moment of memory layers in magnetic tunnel junctions (MTJs), and therefore an external magnetic field is unnecessary as that for a conventional MRAM.

A spin-torque MTJ element has two ferromagnetic layers and a spacer layer between the ferromagnetic layers. One ferromagnetic layer is a pinned magnetic layer and the other ferromagnetic layer is a free magnetic layer. The spacer layer is a tunnel barrier layer. When a spin polarized electron flows through the ferromagnetic layers, the spin direction rotates according to the directions of magnetic moment. The rotation of spin direction of the electrons in the ferromagnetic layers is the origin of a spin-torque to the magnetic moment. If the given torque is large enough, magnetization of ferromagnetic layer and thus the magnetic moment is reversed. The magnetization of the ferromagnetic layers transforms from parallel to anti-parallel alignment. This changes the MTJ element from a low resistance state to a high resistance state thus changing the logic state of the MTJ element from a first logic state (0) to a second logic state (1). A voltage source provides the programming voltage that generates the programming current that is reversed appropriately change the programming state of the MTJ element. Reading an SMT MRAM cell involves applying a voltage across the SMT MRAM cell and detecting the resistance (or current) difference.

Figure 1:
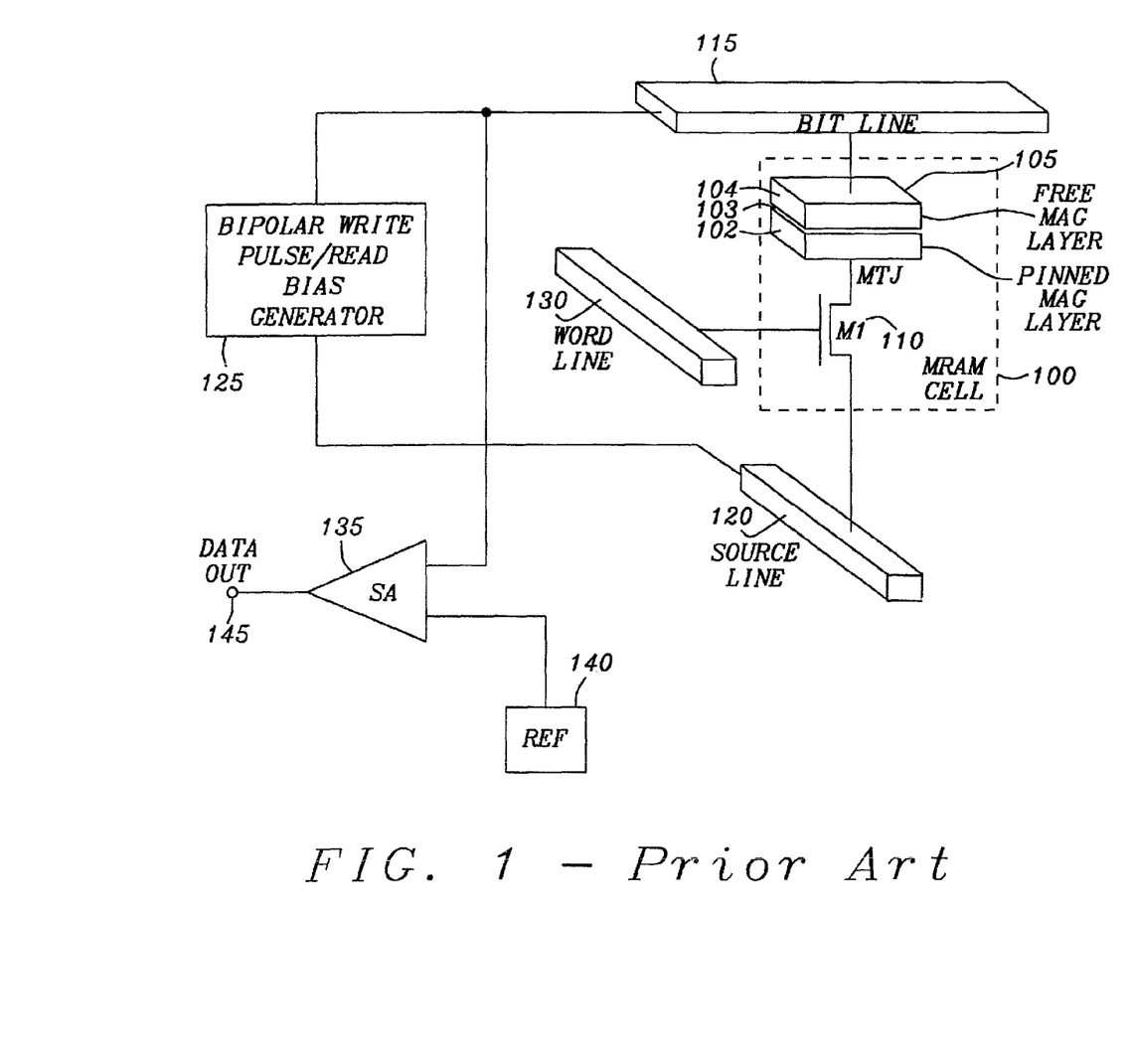
FIG. 1 is a functional diagram of a SMT MRAM memory cell and its peripheral circuitry of the related art.

As illustrated in FIG. 1, a spin moment transfer (SMT) MRAM cell 100 consists of an MTJ element 105 and a Metal Oxide Semiconductor (MOS) gating transistor 110. The MTJ element 105 is composed of a pinned ferromagnetic layer 102 and a free ferromagnetic layer 104, and a tunnel barrier layer 103. The drain of the gating transistor 110 is connected through a nonmagnetic layer to the pinned ferromagnetic layer 102. The free ferromagnetic layer 104 is connected to a bit line 115 and the source of the gating transistor 110 is connected the source line 120. The bit line 115 and source select line 120 are connected to the bipolar write pulse/read bias generator 125. The bipolar write pulse/read bias generator 125 provides the necessary programming current to the MTJ element 105 through the bit line 115 and the source select line 120. The direction being determined by logic state being programmed to the MTJ element 105.

The gate of the gating transistor 110 is connected to a word line 130. The word line 130 transfers a word line select voltage to the gate of the gating transistor 110 to activate the gating transistor 110 for reading or writing the logic state of the MTJ element 105. A sense amplifier 135 has one input terminal connected to the bit line and a second input terminal connected to a voltage reference circuit. When the word line 130 has the word line select voltage activated to turn on the gating transistor 110, the bipolar write pulse/read bias generator 125 generates a bias current that passes through MTJ element 105. A voltage is developed across the MTJ element 105 that is sensed by the sense amplifier 135 and compared with the reference voltage generator to determine the logic state written to the MTJ element 105. This logic state is transferred to the output terminal of the sense amplifier 135 as to the data output signal 145.

Arrays of spin moment transfer (SMT) MRAM cell 100 are arranged in rows and columns. Each row of the spin-transfer based magneto tunnel junction memory devices may have their source line 120 commonly connected to a source line selection circuit or tied to a ground reference point. In other arrangements of an array of SMT MRAM cells 100, as shown in U.S. Patent Application 200/60018057 (Huai), the SMT MRAM cells 100 are organized into an array having two bit lines. The two bit lines are structures such that the current flowing perpendicularly through the MTJ 105 is controlled by the difference of the bias voltages of the two bit lines for each spin moment transfer (SMT) MRAM cell 100. Two reading/writing column selection circuits are provided to control the voltages on the bit lines.

SUMMARY

An object of this disclosure is to provide an array of SMT MRAM cells with paired columns of the SMT MRAM cells having shared bit lines with means for lowering the resistance of the shared bit lines.

Another object of this disclosure is inhibiting program disturbance of a non-selected column of a pair of columns of the SMT MRAM cells.

To accomplish at least one of these objects, an array of SMT MRAM cells is arranged in rows and columns. An array of SMT MRAM cells is arranged in rows and columns. Each of the columns of SMT MRAM cells is associated with one of its adjacent columns of SMT MRAM cells. Each column is connected to a true data bit line and each associated pair of columns of SMT MRAM cells is connected to a shared complement data bit line. A shunting switch device is connected between each of the true data bit lines and the shared complement data bit line for selectively connecting one of the true data bit lines to the shared complement data bit line to effectively reduce the resistance of the complement data bit line and to eliminate program disturb effects in adjacent non-selected columns of the SMT MRAM cells. An activation terminal of each of the shunting switch device is connected to a column address decoder such that the shunting switch device is activated to connect the true data bit line associated with the non-selected column in parallel with the complement data bit line. The shared complement data bit line may be wider than the true data bit line to further lower the resistance of the shared complement data bit line. In some embodiments the shared complement data bit line may be twice the dimension of the true data bit line.

In other embodiments, a bit line structure for connecting columns of SMT MRAM cells within an array of SMT MRAM cells has a true data bit line connected to an MTJ device of each SMT MRAM cell of each column of the SMT MRAM cells. A complement data bit line is connected to a source of a gating transistor of each SMT MRAM cell of the each column of the SMT MRAM cells. The bit line structure has a shunting switch transistor connected between the true data bit line and the complement data bit line of the associated pairs of columns of the SMT MRAM cells. The shunting switch transistors have an activation terminal that, when activated, connects the true data bit line of an unselected column of the SMT MRAM cells in parallel with the shared complement data bit line to effectively reduce program disturb effects in the unselected column of SMT MRAM cells. The shared complement data bit line may be wider than the true data bit line to further lower the resistance of the shared complement data bit line. The shared complement data bit line may be twice the dimension of the true data bit line.

In other embodiments, a method for reducing resistance of a shared bit line and reducing program disturb effects of unselected columns of SMT MRAM cells in an array of SMT MRAM cells begins by providing an array of SMT MRAM cells where columns of the SMT MRAM cells are mutually connected to a shared complement data bit line through the source of a gating transistor of each of the SMT MRAM cells of the pair of columns of SMT MRAM cells. The shared complement data bit line may be wider than the true data bit line to further lower the resistance of the shared complement data bit line. In some embodiments the shared complement data bit line may be twice the dimension of the true data bit line.

Each of the SMT MRAM cells of each column of the SMT MRAM cells is connected to a true data bit line through an MTJ device within the SMT MRAM cells. A source of a gating transistor of the pair of adjacent columns of SMT MRAM cells is connected to a complement data bit line. A shunting switch transistor is connected between the true data bit line and the complement data bit line of the associated pairs of columns of the SMT MRAM cells. During a program operation, an address is decoded to select a row and columns of the array of SMT MRAM cells. An activation terminal of each of the shunting switch transistor of each unselected column of the array of SMT MRAM cells is initiated to turn on the shunting switch transistors to connect the true data bit line of the unselected column of the SMT MRAM cells in parallel with the shared complement data bit line to effectively reduce program disturb effects in the unselected column of SMT MRAM cells. The programming drive current is then activated to program the selected SMT MRAM cells of the selected rows and columns.

Further, in other embodiments, an array of SMT MRAM cells is arranged in rows and columns. Each of the columns of SMT MRAM cells is associated with one of its adjacent columns of SMT MRAM cells. Each column is connected to a true data bit line and to a complement data bit line. A shunting switch device is connected between the true data bit line and the complement data bit line of the connected columns of SMT MRAM cells for selectively connecting one of the true data bit lines to the complement data bit line to effectively reduce the resistance of the complement data bit line and to eliminate program disturb effects in adjacent non-selected columns of the SMT MRAM cells. The complement data bit lines are connected such that they are shared during a program operation to further reduce the resistance of the complement data bit lines. An activation terminal of each of the shunting switch devices is connected to a column address decoder such that the shunting switch device is activated to connect the true data bit line associated with the non-selected column in parallel with the complement data bit line.

Still further, in other embodiments, an array of SMT MRAM cells is arranged in rows and columns. Each of the columns of SMT MRAM cells is associated with one of its adjacent columns of SMT MRAM cells. Each column is connected to a true data bit line and to a complement data bit line. At least one true data bit line shunting switch device is connected between the true data bit line and the complement data bit line of the connected columns of SMT MRAM cells for selectively connecting one of the true data bit lines to the complement data bit line. The complement data bit lines of the associated adjacent columns have at least one complement data bit line shunting switch device connected between the adjacent complement data bit lines such that they are shared during a program operation to further reduce the resistance of the complement data bit lines. An activation terminal of each of the shunting switch devices is connected to a column address decoder such that the shunting switch device is activated to connect the two complement data bit lines and the true data bit line associated with the non-selected column in parallel to effectively reduce the resistance of the complement data bit line and to eliminate program disturb effects in adjacent non-selected columns of the SMT MRAM cells.

DETAILED DESCRIPTION

Figure 2:
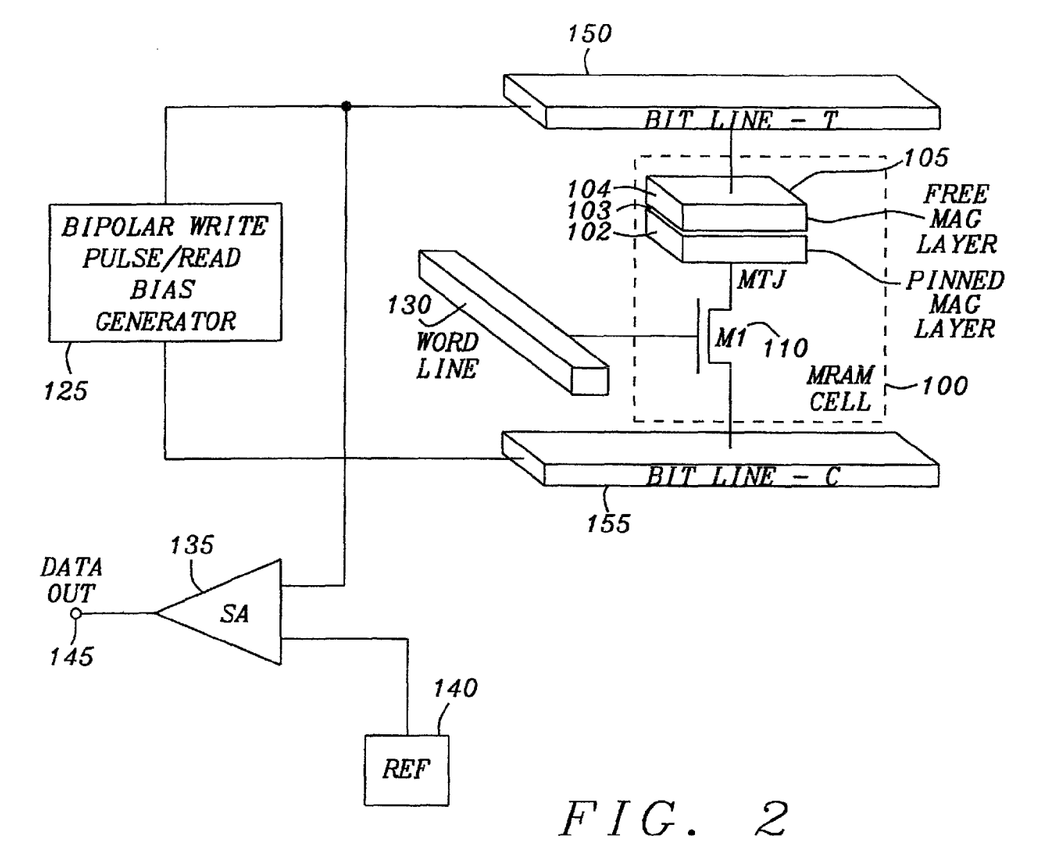
FIG. 2 is a functional diagram of a SMT MRAM memory cell and its peripheral circuitry.

The embodiments of SMT MRAM cell arrays have columns of SMT MRAM memory cells with pairs of bit lines, for the sake of convention, have one of the bit line referred to as a true data bit line and the other bit line referred to as the complement data bit line. In the related art, as described in Huai, FIG. 9, each column of cells has a pair of bit lines. Such architecture has too many bit lines and the bit line connecting to the source sides of gating transistor 110 of FIG. 2 is highly resistive. High bit line resistance puts constraint on how many cells that may be grouped in a basic array with decoders and drivers. In embodiments of this disclosure, adjacent pairs of columns are connected to share a bit the complement data bit lines. The complement data bit lines are effectively merged to form the complement data bit lines. Therefore, in some embodiments, the complement data bit lines are formed to be much wider and therefore less resistive. This permits a larger and more efficient array in terms of area. However, in the shared complement data bit line structure, the adjacent SMT MRAM memory cell of an SMT MRAM memory cell being programmed will be disturbed during programming. To effectively reduce program disturb effects in the unselected column of SMT MRAM cells, shunting switch transistors are added between each of the true data bit lines and the shared complement data bit lines.

Referring to FIG. 2, the structure of the SMT MRAM memory cell is essentially identical to that of FIG. 1, except the source of the gating transistor 110 of the SMT MRAM memory cell 100 is connected to the shared complement data bit line 155. In the embodiments, the complement data bit line 155 is structured to be in parallel with the true data bit line 150. The true data bit line 150 is connected to the free ferromagnetic layer 104 of the MTJ element 105. The true data bit line 150 and the complement data bit line 155 are connected to THE bipolar write pulse/read bias generator 125. The complement data bit line 155 is shared with an identical SMT MRAM memory cell 100 in an adjacent column of SMT MRAM memory cells 100.

The complement data bit line 155 that is connected to the source of the gating transistor 110, is the first metal layer line in the physical construction of the SMT MRAM memory cell 100. The true data bit line 150 is the last, or the top most metal line in the physical cell stack. The first metal bit line of the complement data bit line 155 has to share the space with vias connecting the drain side of the gating transistor 110 to the bottom plate 102 of MTJ element 105 thus forcing the first metal bit line of the complement data bit line 155 usually to be thinner. The first metal bit line of the complement data bit line 155 being narrower and thinner are therefore much more resistive than the top true data bit line 150. By sharing two adjacent complement data bit lines 155, the width of shared line is effectively wider by three times—two lines plus the spacing between the two adjacent complement data bit lines 155. The disadvantage of doing so is that the SMT MRAM memory cell 100 adjacent to the cell being programmed will see a disturb condition because they share the same selected word line 130. The shunting transistor (or transistors if we put more than one between the bit lines true and complement) will help to reduce this disturb condition. The further reduction in resistance of the two adjacent complement data bit lines 155 comes from the neighboring true bit line 150 is also in parallel with the complement bit line 155. But this requires more than one shunting transistor between the true and complement bit lines.

Figure 3:
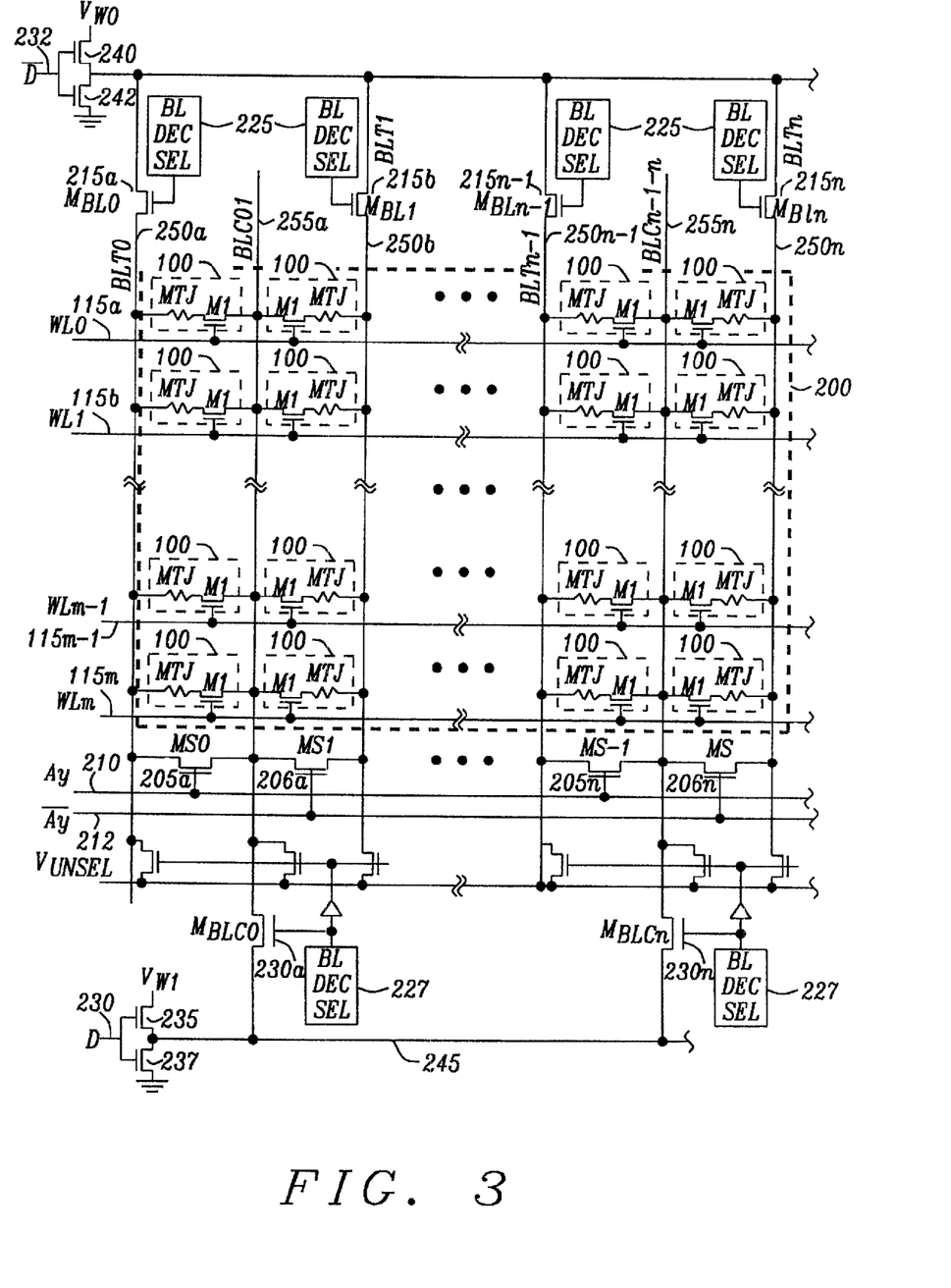
FIG. 3 is a schematic diagram of an embodiment of an array of SMT MRAM memory cells.

FIG. 3 illustrates an embodiment of an array 200 of the SMT MRAM memory cells 100. The SMT MRAM memory cells 100 are arranged into rows and columns to form the array 200. The MTJ element of each SMT MRAM memory cells 100 is connected to one of the true data bit lines 250a, 259b, ... 250n.

Adjacent columns of SMT MRAM memory cells 100 are associated with each other. A shunting switch transistor 205a, ..., 205n and 206a, ..., 206n connects each true data bit line 250a, 250b, ..., 250n-1, 250n to its associated shared complement data bit line 255a, ..., 255n. A first source/drain of each of the shunting switch transistor 205a, ..., 205n and 206a, ..., 206n is connected to the true data bit line 250a, 250b, ..., 250n-1, 250n. The second source/drain of each of the shunting switch transistor 205a, ..., 205n and 206a, ..., 206n is connected to one shared complement data bit line 255a, ..., 255n. The gate of each of the shunting switch transistors 205a, ..., 205n is connected to the in-phase column address select bit Ay 210 and the gate of each of the shunting switch transistor 206a, ..., 206n is connected to the out-of-phase column address select bit $\overline{Ay}$ 212. The in-phase column address select bit Ay and the out-of-phase column address select bit $\overline{Ay}$ 212 originate from a column or bit line decoder selector that decodes an address to select the columns of the array 200 for programming, reading, and erasing.

Each of the true data bit lines 250a, 250b, ..., 250n-1, 250n is connected to a first source/drain of a true data bit line switch transistor 215a, 215b, ..., 215n-1, 215n. The second source/drain of each of the true data bit line switch transistors 215a, 215b, ..., 215n-1, 215n is connected to a true program data voltage distribution line 247. Each shared complement data bit line 255a, ..., 255n is connected to a first source/drain of each of the complement data bit line switch transistors 220a, ..., 220n. The second source/drain of each of the complement data bit line switch transistors 220a, ..., 220n is connected to a complement data program voltage distribution line 245. The gates of the true data bit line switch transistors 215a, 215b, ..., 215n-1, 215n are connected to the bit line decode select circuit 227. The decode select circuit 225 receives an address, decodes the address and activates the appropriate gate of the true data bit line switch transistors 215a, 215b, ..., 215n-1, 215n to activate the selected column or columns for programming, erasing, and reading the selected SMT MRAM memory cells 100.

Each of the complement data bit lines 255a, 255b, ..., 255n-1, 255n is connected to a first source/drain of a complement data bit line switch transistor 220a, 220b, ..., 220n-1, 220n. The second source/drain of each of the complement data bit line switch transistors 220a, 220b, ..., 220n-1, 220n is connected to a program voltage distribution line 245. Each shared complement data bit line 255a, ..., 255n is connected to a first source/drain of each of the complement data bit line switch transistors 220a, ..., 220n. The second source/drain of each of the complement data bit line switch transistors 220a, ..., 220n is connected to a program voltage distribution line 245. The gates of the complement data bit line switch transistors 220a, 220b, ..., 220n-1, 220n are connected to the bit line decode select circuit 225. As above, the decode select circuit 225 receives an address, decodes the address and activates the appropriate gate of the complement data bit line switch transistors 220a, 220b, ..., 220n-1, 220n to activate the selected column or columns for programming, erasing, and reading the selected SMT MRAM memory cells 100.

During programming of selected SMT MRAM memory cells 100, the shunting switch transistors 205a, ..., 205n are activated to effectively place unselected true data bit line 250a, 250b, ..., 250n-1, 250n in parallel with the shared complement data bit line 255a, ..., 255n for each paired columns of the SMT MRAM memory cells 100. By placing the true data bit line 250a, 250b, ..., 250n-1, 250n in parallel with the shared complement data bit line 255a, ..., 255n, the resistance of the shared complement data bit line 255a, ..., 255n is effectively decreased and prevents disturb program currents from passing through the unselected SMT MRAM cells 100.

Figure 4:
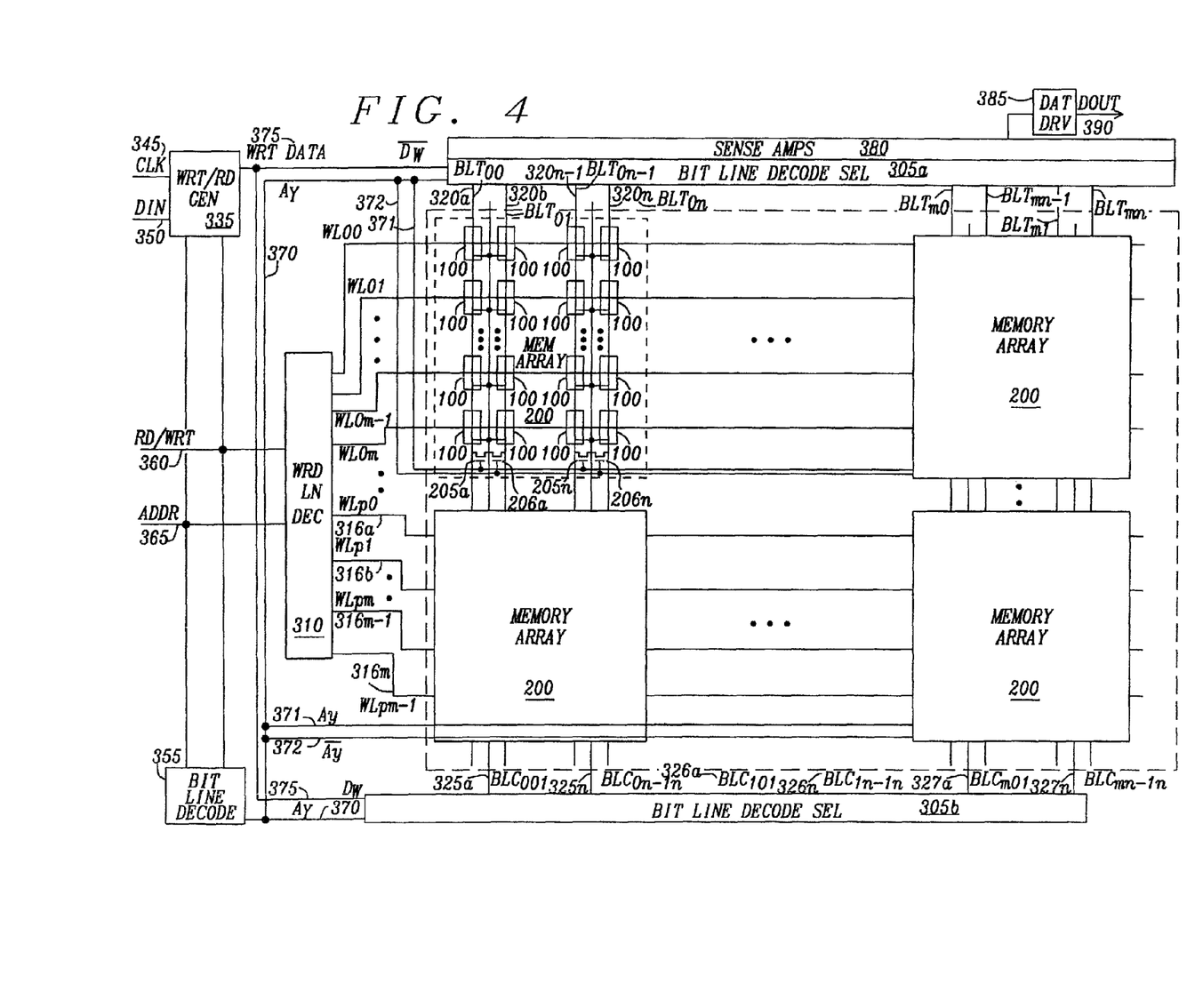
FIG. 4 is block diagram of an embodiment of an SMT MRAM memory device.

FIG. 4 is block diagram of an embodiment of an SMT MRAM memory device showing a shared bit line structure with shunting switch transistors between the true data bit lines and the shared complement data bit lines. The SMT MRAM memory device has an array of SMT MRAM memory cells 100 that is formed of multiple sub-arrays 200 of SMT MRAM memory cells 100. The SMT MRAM memory cells 100 are formed in rows and columns with the structure as described in FIG. 2. With each row of the SMT MRAM memory cells 100 are connected to one of the word lines 315a, ..., 315m, 316a, ..., 316m. Each column of the SMT MRAM memory cells 100 is connected to one of the true data bit lines 320a, 320b, ..., 320n-1, 320n, 321a, 321b, ..., 321n-1, 321n, and 322a, 322b, ..., 322n-1, 322n. Adjacent columns are paired and connected to one of the shared complement data bit line 325a, ..., 325m, 326a, ..., 326m, and 327a, ..., 327m. The true data bit lines 320a, 320b, ..., 320n-1, 320n, 321a, 321b, ..., 321n-1, 321n, and 322a, 322b, ..., 322n-1, 322n are connected to their associated shared complement data bit line 325a, ..., 325m, 326a, ..., 326m, and 327a, ..., 327m through their respective shunting switch transistors 205 and 206 to selectively connected the true data bit lines 320a, 320b, ..., 320n-1, 320n, 321a, 321b, ..., 321n-1, 321n, and 322a, 322b, ..., 322n-1, 322n of the unselected column of SMT MRAM memory cells 100 to the associated shared complement data bit line 325a, ..., 325m, 326a, ..., 326m, and 327a, ..., 327m as described above.

The true data bit lines 320a, 320b, ..., 320n-1, 320n, 321a, 321b, ..., 321n-1, 321n, and 322a, 322b, ..., 322n-1, 322n are connected to the bit line decode selector circuit 305a. The shared complement data bit line 325a, ..., 325m, 326a, ..., 326m, and 327a, ..., 327m are connected to the bit line decode selector circuit 305b The bit line decode selector circuits 305a and 305b are connected to the bit line decode circuit 355 The bit line decode circuit receives the external address lines 365 and the external control lines 360 and decodes the decoded address 370 and transmits the decoded address 370 to the bit line decode selector circuits 305a and 305b to select the desired columns of selected sub-arrays 200 of the SMT MRAM memory cells 100.

The write/read generator 335 receives the clock timing signal 345 and the data input signal 350 and conditions and amplifies the data input signal 350 to form the true program data $D_W$ 375 and the complement data program 376. The true program data $D_W$ 375 and the complement data program $\overline{D}_W$ 376 are transferred respectively through the bit line decode selector circuits 305a and 305b to the appropriate true data bit lines 320a, 320b, ..., 320n-1, 320n, 321a, 321b, ..., 321n-1, 321n, and 322a, 322b, ..., 322n-1, 322n and the shared complement data bit lines 325a, ..., 325m, 326a, ..., 326m, and 327a, ..., 327m.

During a programming operation, the shunting switch transistors 205 and 206 of the unselected columns are activated to shunt the true data bit lines 320a, 320b, ..., 320n-1, 320n, 321a, 321b, ..., 321n-1, 321n, and 322a, 322b, ..., 322n-1, 322n of the unselected columns to shared complement data bit lines 325a, ..., 325m, 326a, ..., 326m, and 327a, ..., 327m to prevent disturb program currents from passing through the unselected SMT MRAM cells 100 and to further decrease the effective resistance of the complement data bit lines 325a, ..., 325m, 326a, ..., 326m, and 327a, ..., 327m.

During a read operation, a read current is passed from the bit line decode selector 305a through the selected true data bit lines 320a, 320b, ..., 320n-1, 320n, 321a, 321b, ..., 321n-1, 321n, and 322a, 322b, ..., 322n-1, 322n to the MTJ of the SMT MRAM memory cells 100 to the shared complement data bit line 325a, ..., 325m, 326a, ..., 326m, and 327a, ..., 327m to the bit line decode selector 305b. The sense amplifiers are connected to the through the bit line decode selector 305a to sense the voltage developed across the MTJ of the selected SMT MRAM memory cells 100 to detect the data stored in the selected SMT MRAM 100. The data driver 385 receives the captured data conditions and amplifies the data to generate the output data 390 that is transferred to external circuitry.

Figure 5:
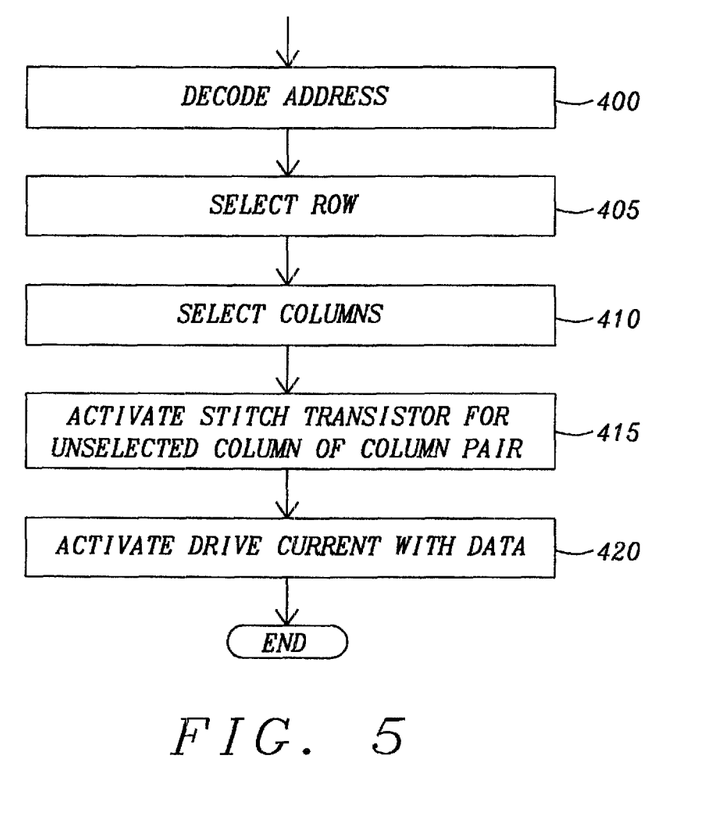
FIG. 5 is a flow diagram for a method to effectively reduce program disturb effects in the unselected column of SMT MRAM cells.

Refer now to FIG. 5 for a discussion of an embodiment of a method to reduce the resistance of a complement data bit line during a programming operation and to effectively reduce program disturb effects in unselected columns of SMT MRAM memory cells. A provided array of SMT MRAM memory cells is structured and operates as described in FIG. 3 where columns of the SMT MRAM cells are mutually connected to a shared complement data bit line through the source of a gating transistor of each of the SMT MRAM cells of the pair of columns of SMT MRAM cells. Each of the SMT MRAM cells of each column of the SMT MRAM cells is connected to a true data bit line. Each of the true data bit lines is connected to an MTJ device within the SMT MRAM cells. A source of a gating transistor of the pair of adjacent columns of SMT MRAM cells is connected to a complement data bit line. A shunting switch transistor is connected between the true data bit line and the complement data bit line of the associated pairs of columns of the SMT MRAM cells. During a program operation, an address is decoded (Box 400) to select a row (Box 405) and columns (Box 410) of the array of SMT MRAM cells. A gating terminal of each of the shunting switch transistor of each unselected column of the array of SMT MRAM cells is activated (Box 415) to turn on the shunting switch transistors to connect the true data bit line of the unselected columns of the SMT MRAM cells in parallel with the shared complement data bit line to effectively reduce program disturb effects in the unselected column of SMT MRAM cells. The programming drive current is then activated (Box 420) to program the selected SMT MRAM cells of the selected rows and columns.

Figure 6:
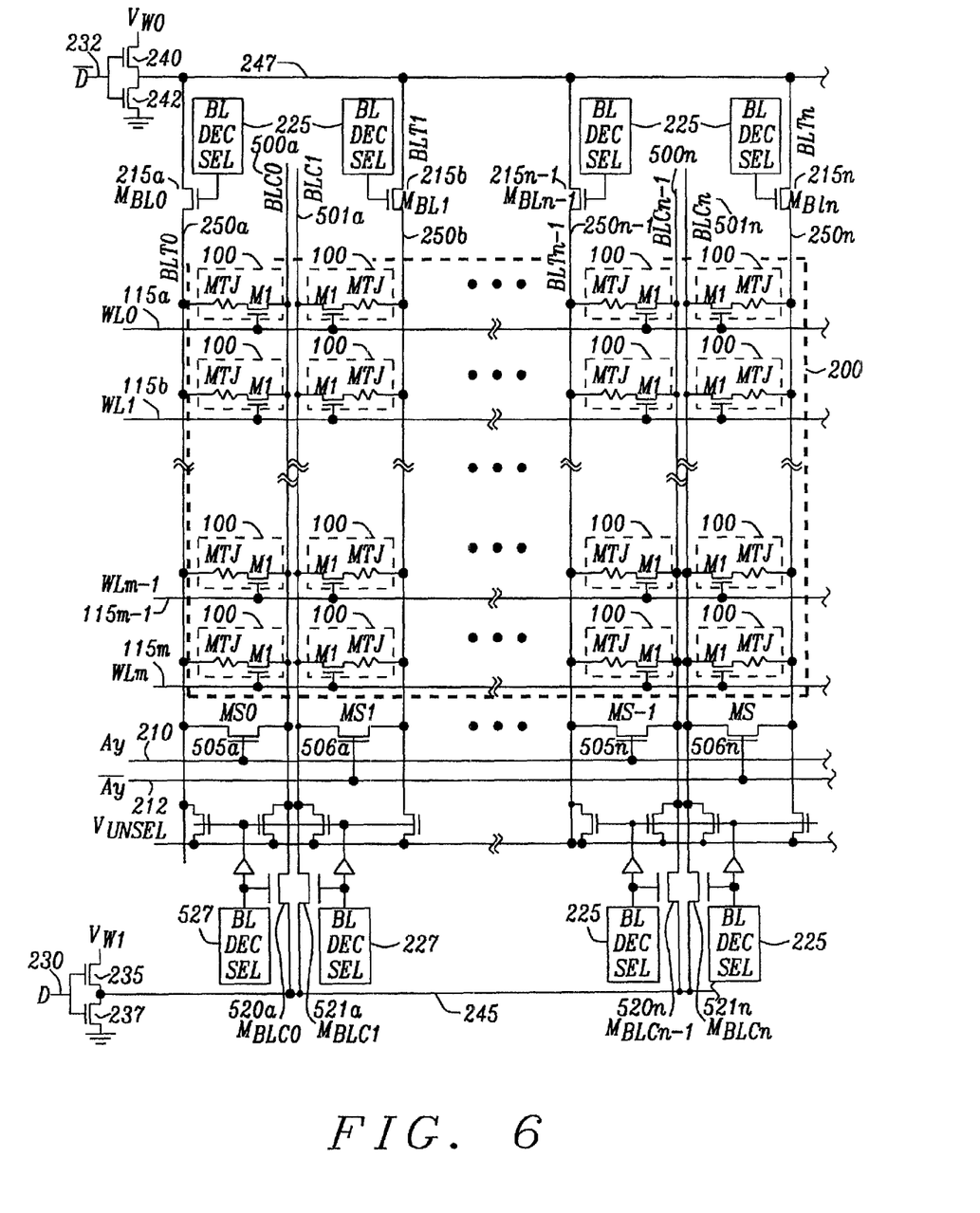
FIG. 6 is a schematic diagram of another embodiment of an array of SMT MRAM memory cells having shunting switch transistors.

FIG. 6 illustrates an alternate embodiment of an array 200 of the SMT MRAM memory cells 100. The SMT MRAM memory cells 100 are arranged into rows and columns to form the array 200 as described above in FIG. 3. The MTJ element of each SMT MRAM memory cells 100 is connected to one of the true data bit lines 250a, 259b, ..., 250n and to one of the complement data bit line 500a, ..., 500n and, 501a, ..., 501n.

Adjacent columns of SMT MRAM memory cells 100 are associated with each other. A shunting switch transistor 505a, ..., 505n and 506a, ..., 506n connects each true data bit line 250a, 250b, ..., 250n-1, 250n to its associated complement data bit line 500a, ..., 500n and 501a, ..., 501n. A first source/drain of each of the shunting switch transistors 505a, ..., 505n and 506a, ..., 506n is connected to the true data bit line 250a, 250b, ..., 250n-1, 250n. The second source/drain of each of the shunting switch transistors 505a, ..., 505n and 506a, ..., 506n is connected to one associated complement data bit line 500a, ..., 500n and 501a, ..., 501n. The gate of each of the shunting switch transistors 505a, ..., 505n is connected to the in-phase column address select bit Ay 210 and the gate of each of the shunting switch transistor 506a, ..., 506n is connected to the out-of-phase column address select bit $\overline{Ay}$ 212. The in-phase column address select bit Ay and the out-of-phase column address select bit $\overline{Ay}$ 212 originate from a column or bit line decoder selector that decodes an address to select the columns of the array 200 for programming, reading, and erasing.

Each of the true data bit lines 250a, 250b, ..., 250n-1, 250n is connected to a first source/drain of a true data bit line switch transistor 215a, 215b, ..., 215n-1, 215n. The second source/drain of each of the true data bit line switch transistors 215a, 215b, ..., 215n-1, 215n is connected to a true program data voltage distribution line 247. Each shared complement data bit line 500a, ..., 500n and 501a, ..., 501n is connected to a first source/drain of each of the complement data bit line switch transistors 220a, . . . , 215n. The second source/drain of each of the complement data bit line switch transistors 220a, . . . , 215n is connected to a complement data program voltage distribution line 245. The gates of the true data bit line switch transistors 215a, 215b, . . . , 215n-1, 215n are connected to the bit line decode select circuit 225. The decode select circuit 225 receives an address, decodes the address and activates the appropriate gate of the true data bit line switch transistors 215a, 215b, . . . , 215n-1, 215n to activate the selected column or columns for programming, erasing, and reading the selected SMT MRAM memory cells 100.

Each of the complement data bit lines 500a, . . . , 500n is connected to a first source/drain of a complement data bit line switch transistor 520a, . . . , 520n and each of the complement data bit lines 501a, . . . , 501n is connected to the first source/drain of a complement data bit line switch transistors 521a, . . . , 521n. The second source/drain of each of the complement data bit line switch transistors 520a, . . . , 520n and 521a, . . . , 521n is connected to a program voltage distribution line 245. The gates of the complement data bit line switch transistors 520a, . . . , 520n and 521a, . . . , 521n are connected to the bit line decode select circuit 225. As above, the decode select circuit 225 receives an address, decodes the address and activates the appropriate gate of the complement data bit line switch transistors 520a, . . . , 520n and 521a, . . . , 521n to activate the selected column or columns for programming, erasing, and reading the selected SMT MRAM memory cells 100.

During programming of selected SMT MRAM memory cells 100, the shunting switch transistors 505a, . . . , 505n and 506a, . . . , 506n are selectively activated to effectively place unselected true data bit lines 250a, 250b, . . . , 250n-1, 250n in parallel with their associated complement data bit line 500a, . . . , 500n and 501a, . . . , 501n for each of the columns of the SMT MRAM memory cells 100. By placing the true data bit line 250a, 250b, . . . , 250n-1, 250n in parallel with the complement data bit line 500a, . . . , 500n and 501a, . . . , 501n, the resistance of the complement data bit line 500a, . . . , 500n and 501a, . . . , 501n is effectively decreased and prevents disturb program currents from passing through the unselected SMT MRAM cells 100. Further during programming the complement data bit line switch transistors 520a, . . . , 520n and 521a, . . . , 521n of the unselected columns are activated to effectively place the complement data bit line 500a, . . . , 500n and 501a, . . . , 501n of the selected column in parallel with the complement data bit line 500a, . . . , 500n and 501a, . . . , 501n of the associated adjacent unselected column of the SMT MRAM memory cells 100. The placing the complement data bit lines 500a, . . . , 500n and 501a, . . . , 501n of the associated adjacent selected and unselected bit lines in parallel effectively reduces the resistance of the complement data bit line 500a, . . . , 500n and 501a, . . . , 501n of the selected columns of SMT MRAM memory cells 100 and any magnetic field resulting in a program disturb of the unselected SMT MRAM memory cells 100 is mitigated.

The bit line decode selector circuit 225 must be structured to activate the complement data bit line switch transistors 520a, . . . , 520n and 521a, . . . , 521n appropriately for the unselected complement data bit line 500a, . . . , 500n and 501a, . . . , 501n to connected selected and unselected complement data bit line 500a, . . . , 500n and 501a, 501n in parallel. The bit line decode selector circuit 225 must further deactivate the true data bit line switch transistors 215a, 215b, . . . , 215n-1, 215n for the unselected true data bit lines 250a, 250b, . . . , 250n-1, 250n to prevent the true program data voltage distribution line 247 from being applied to the unselected true data bit lines 250a, 250b, . . . , 250n-1, 250n and thus to the selected and unselected complement data bit lines 500a, . . . , 500n and 501a, . . . , 501n.

Figure 7:
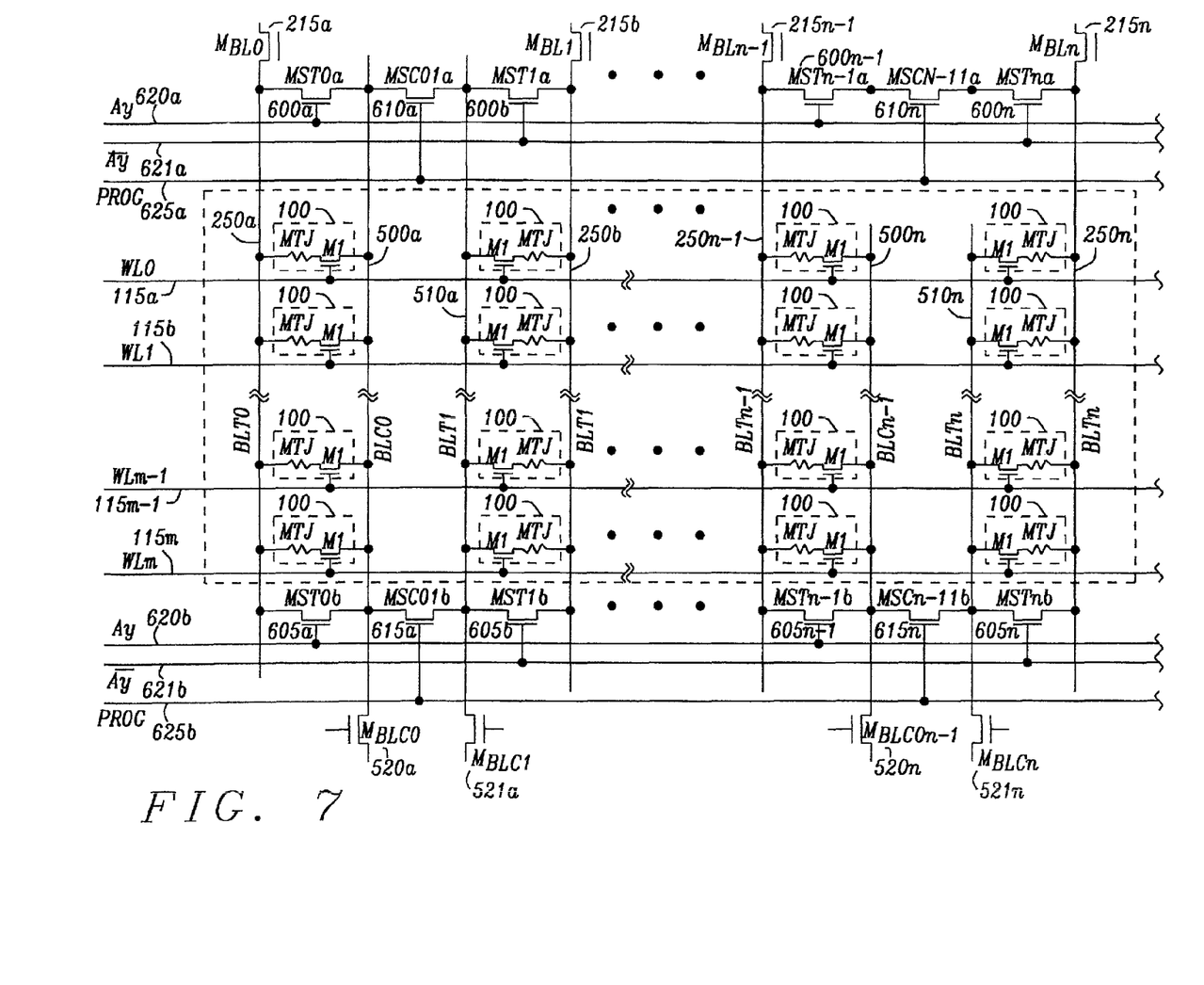
FIG. 7 is a schematic diagram of still another embodiment of an array of SMT MRAM memory cells having shunting switch transistors.

FIG. 7 illustrates a generalized embodiment of an array 200 of the SMT MRAM memory cells 100. The SMT MRAM memory cells 100 are arranged into rows and columns to form the array 200 as described above in FIGS. 3 and 6. The MTJ element of each SMT MRAM memory cells 100 is connected to one of the true data bit lines 250a, 259b, . . . , 250n and to one of the complement data bit line 500a, . . . , 500n and 501a, . . . , 501n.

Adjacent columns of SMT MRAM memory cells 100 are associated with each other. A shunting switch transistor 600a, . . . , 600n, 601a, . . . , 601n, 605a, . . . , 605n and 606a, . . . , 606n connects each true data bit line 250a, 250b, . . . , 250n-1, 250n to its associated complement data bit line 500a, . . . , 500n and 501a, . . . , 501n. A first source/drain of each of the shunting switch transistors 600a, . . . , 600n, 601a, . . . , 601n, 605a, . . . , 605n and 606a, . . . , 606n is connected to one of the true data bit lines 250a, 250b, . . . , 250n-1, 250n. The second source/drain of each of the shunting switch transistors 600a, . . . , 600n, 601a, . . . , 601n, 605a, . . . , 605n and 606a, . . . , 606n is connected to one associated complement data bit line 500a, . . . , 500n and 501a, . . . , 501n. The gate of each of the shunting switch transistors 600a, . . . , 600n, and 605a, . . . , 605n is connected to the in-phase column address select bit Ay 620a and 620b and the gate of each of the shunting switch transistor 601a, . . . , 601n and 606a, . . . , 606n is connected to the out-of-phase column address select bit $\overline{Ay}$ 621a and 621b. The in-phase column address select bit Ay 620a and 620b and the out-of-phase column address select bit $\overline{Ay}$ 621a and 621b originate from a column or bit line decoder selector that decodes an address to select the columns of the array 200 for programming, reading, and erasing. In the generalized embodiment there may be an number of the shunting switch transistors 600a, . . . , 600n, 601a, . . . , 601n, 605a, . . . 605n and 606a, . . . , 606n placed in parallel between the true data bit lines 250a, 250b, . . . , 250n-1, 250n and their associated complement data bit lines 500a, . . . , 500n and 501a, . . . , 501n with two of the shunting switch transistors 600a, . . . , 600n, 601a, . . . , 601n, 605a, . . . , 605n and 606a, . . . , 606n connected between each of the true data bit line 250a, 250b, . . . , 250n-1, 250n and their associated complement data bit line 500a, . . . , 500n and 501a, . . . , 501n.

Each of the complement data bit lines 500a, . . . , 500n and 501a, . . . , 501n of the associated columns of SMT MRAM's 100 has a pair of complement bit line shunting transistors 615a, . . . , 615n and 616a, . . . , 616n. Again as described above, in the generalized embodiment, the number of complement bit line shunting transistors 615a, . . . , 615n and 616a, . . . , 616n may be any number to assist in reducing the resistance of the complement data bit line 500a, . . . , 500n and 501a, . . . , 501n, with the two of this illustration being exemplary. A first source/drain of the complement bit line shunting transistors 615a, . . . , 615n and 616a, . . . , 616n is connected to a first of the complement data bit lines 500a, . . . , 500n and 501a, . . . , 501n and a second source/drain of the complement data bit line 500a, . . . , 500n and 501a, . . . , 501n being connected to a second of the associated complement data bit lines 500a, . . . , 500n and 501a, . . . , 501n. The gates of the complement bit line shunting, transistors 615a, . . . , 615n and 616a, . . . , 616n are connected to a program command signal to activate the connection of the associated complement data bit line 500a, . . . , 500n and 501a, . . . , 501n through the complement bit line shunting transistors 615a, 615n and 616a, . . . , 616n during a program operation and to disconnect the complement bit line shunting transistors 615a, ..., 615n and 616a, ..., 616n during read and erase operations.

As shown in FIG. 6, each of the true data bit lines 250a, 250b, 250n-1, 250n is connected to a first source/drain of a true data bit line switch transistor 215a, 215b, ..., 215n-1, 215n. The second source/drain of each of the true data bit line switch transistors 215a, 215b, ..., 215n-1, 215n is connected to a true program data voltage distribution line 247. Each shared complement data it line 500a, ..., 500n and 501a, ..., 501n is connected to a first source/drain of each of the complement data bit line switch transistors 220a, ..., 215n. The second source/drain of each of the complement data bit line switch transistors 220a, ..., 215n is connected to a complement data program voltage distribution line 245. The gates of the true data bit line switch transistors 215a, 215b, ..., 215n-1, 215n are connected to the bit line decode select circuit 225. The decode select circuit 225 receives, an address, decodes the address and activates the appropriate gate of the true data bit line switch transistors 215a, 215b, ..., 215n-1, 215n to activate the selected column or columns for programming, erasing, and reading the selected SMT MRAM memory cells 100.

Further, as shown in FIG. 6, each of the complement data bit lines 500a, ..., 500n is connected to a first source/drain of a complement data bit line switch transistor 520a, ..., 520n and each of the complement data bit lines 501a, ..., 501n is connected to the first source/drain of a complement data bit line switch transistors 521a, ..., 521n. The second source/drain of each of the complement data bit line switch transistors 520a, ..., 520n and 521a, ..., 521n is connected to a program voltage distribution line 245. The gates of the complement data bit line switch transistors 220a, 220b, ..., 220n-1, 220n are connected to the bit line decode select circuit 225. As above, the decode select circuit 225 receives an address, decodes the address and activates the appropriate gate of the complement data bit line switch transistors 2 520a, ..., 520n and 521a, ..., 521n to activate the selected column or columns for programming, erasing, and reading the selected SMT MRAM memory cells 100.

During programming of selected SMT MRAM memory cells 100, the in-phase column address select bit Ay 620a and 620b and the out-of-phase column address select bit $\overline{Ay}$ 621a and 621b are selectively activated to turn on the selected shunting switch transistors 600a, ..., 600n, 601a, ..., 601n, 605a, ..., 605n and 606a, ..., 606n to effectively place unselected true data bit lines 250a, 250b, ..., 250n-1, 250n in parallel with their associated complement data bit line 500a, ..., 500n and 501a, ..., 501n for each of the columns of the SMT MRAM memory cells 100. The Program command signals 625a and 625b are activated to turn on the selected complement bit line shunting transistors 615a, ..., 615n and 616a, ..., 616n place the complement data bit lines 500a, ..., 500n and 501a, ..., 501n of the associated column pairs of the SMT MRAM memory cells 100 in parallel to further reduce the resistance of the complement data bit line 500a, ..., 500n and 501a, ..., 501n.

By placing the true data bit line 250a, 250b, ..., 250n-1, 250n in parallel With the complement data bit line 500a, ..., 500n and 501a, ..., 501n, the resistance of the complement data bit line 500a, ..., 500n and 501a, ..., 501n is effectively decreased and any magnetic field resulting in a program disturb of the unselected SMT MRAM memory cells 100 is mitigated.

The bit line decode selector circuit 225 must deactivate the true data bit line switch transistors 215a, 215b, ..., 215n-1, 215n for the unselected true data bit lines 250a, 250b, ..., 250n-1, 250n to prevent the true program data voltage distribution line 247 from being applied to the unselected true data bit lines 250a, 250b, ..., 250n-1, 250n and thus to the selected and unselected complement data bit lines 500a, ..., 500n and 501a, ..., 501n.

The placing of the shunting switch transistors 600a, ..., 600n, 601a, ..., 601n, 605a, ..., 605n and 606a, ..., 606n and the complement bit line shunting transistors 615a, ..., 615n and 616a, ..., 616n in the various locations through out the array 200 of SMT MRAM memory cells 100 of FIGS. 3, 4, 6, and 7 as stated above decreases the resistance of the complement data bit lines 500a, ..., 500n and 501a, ..., 501n, therefore a larger and more efficient array in terms of area is now formed.

While this disclosure has been particularly shown and described with reference to the preferred embodiments thereof, it will be understood by those skilled in the art that various changes in form and details may be made without departing from the spirit and scope of the disclosure.

What is claimed is:

1. An SMT MRAM device comprising:
SMT MRAM memory cells arranged in an array of rows and columns such that each of the columns of SMT MRAM cells is associated with one of its adjacent columns of SMT MRAM cells;
a plurality of true data bit lines where each of the true data bit lines is connected to one adjacent column;
a plurality of complement data bit lines, wherein each of the plurality of complement data bit lines are connected with each SMT MRAM cell of a pair of columns of the SMT MRAM cells such that each of the plurality of complement data bit lines is shared with the pair of columns of the SMT MRAM cells; and
a plurality of shunting switch devices, wherein each of the shunting switch devices is connected between one of the true data bit lines and the shared complement data bit line for selectively connecting one of the true data bit lines to the shared complement data bit line to effectively reduce the resistance of the complement data bit line and to eliminate program disturb effects in adjacent non-selected columns of the SMT MRAM cells.

2. The SMT MRAM device of claim 1 further comprising a column address decoder in communication with an activation terminal of each of the shunting switch devices such that the shunting switch device is activated to connect the true data bit line associated with the non-selected column in parallel with the complement data bit line.

3. The SMT MRAM device of claim 1 wherein the shared complement data bit line is wider than the true data bit line to further lower the resistance of the shared complement data bit line.

4. The SMT MRAM device of claim 3 wherein the shared complement data bit line is twice the dimension of the true data bit line.

5. The array of SMT MRAM cells of claim 3 further comprising means for selectively connecting the two adjacent complement bit lines in parallel to merge the two adjacent complement bit lines to appear much wider and therefore less resistive to permit a larger and more area efficient array of SMT MRAM cells.

* * * * *